(12) United States Patent
Baldwin

(10) Patent No.: US 9,046,778 B2
(45) Date of Patent: *Jun. 2, 2015

(54) METHOD OF IMPROVING PRINT PERFORMANCE IN FLEXOGRAPHIC PRINTING PLATES

(71) Applicant: MacDermid Printing Solutions, LLC, Waterbury, CT (US)

(72) Inventor: Kyle P. Baldwin, Acworth, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/302,512

(22) Filed: Jun. 12, 2014

(65) Prior Publication Data
US 2014/0295352 A1 Oct. 2, 2014

Related U.S. Application Data

(63) Continuation of application No. 13/595,473, filed on Aug. 27, 2012, now Pat. No. 8,790,864.

(51) Int. Cl.
*G03F 7/20* (2006.01)
(52) U.S. Cl.
CPC .................................. *G03F 7/201* (2013.01)

(58) Field of Classification Search
CPC ................................... G03F 7/20; G03F 7/201
USPC ........................................................... 430/306
See application file for complete search history.

(56) References Cited

U.S. PATENT DOCUMENTS

2009/0042138 A1* 2/2009 Roberts et al. ............... 430/300
2011/0079158 A1* 4/2011 Recchia et al. ............... 101/395

* cited by examiner

*Primary Examiner* — Chanceity Robinson
(74) *Attorney, Agent, or Firm* — Carmody Torrance Sandak & Hennessey LLP

(57) ABSTRACT

A method of tailoring the shape of a plurality of relief printing dots created in a photosensitive printing blank during a platemaking process is provided. The photocurable layer is exposed to actinic radiation using an array of UV LED light assemblies and the use of the array of UV LED light assemblies produces relief printing dots having at least one geometric characteristic selected from the group consisting of a desired planarity of a top surface of the relief printing dots, a desired shoulder angle of the relief printing dots and a desired edge sharpness of the relief printing dots.

14 Claims, 13 Drawing Sheets

Hi level I-651/ 395 nm/ 20%/ 250X

Lo 819/ 395 nm/ 5%/ 250X

Hi level I-369/ 395 nm/ 5%/ 250X

Lo 369/ 395 nm/ 7%/ 250X

Hi level TPO/ 395 nm/ 5%/ 250X

Lo TPO/ 395 nm/ 5%/ 250X

Hi level TPO/ 415 nm/ 6%/ 250X

Lo TPO/ 415 nm/ 10%/ 250X

Lo 819/ 415 nm/ 10%/ 250X

METHOD OF IMPROVING PRINT PERFORMANCE IN FLEXOGRAPHIC PRINTING PLATES

FIELD OF THE INVENTION

The present invention relates generally to a method of tailoring the shape of printing dots created during the production of relief image printing plates to configure such printing dots for optimal printing on various substrates.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography.

Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made. A typical flexographic printing plate as delivered by its manufacturer is a multilayered article made of in order, a backing or support layer; one or more unexposed photocurable layers; optionally a protective layer or slip film; and often, a protective cover sheet.

The support (or backing) layer lends support to the plate. The support layer can be formed from a transparent or opaque material such as paper, cellulose film, plastic, or metal. Preferred materials include sheets made from synthetic polymeric materials such as polyesters, polystyrene, polyolefins, polyamides, and the like. One widely used support layer is a flexible film of polyethylene terephthalate.

The photocurable layer(s) can include any of the known photopolymers, monomers, initiators, reactive or non-reactive diluents, fillers, and dyes. As used herein, the term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional relief pattern of cured material. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may also be used.

Photocurable materials generally cross-link (cure) and harden through radical polymerization in at least some actinic wavelength region. As used herein, "actinic radiation" is radiation that is capable of polymerizing, crosslinking or curing the photocurable layer. Actinic radiation includes, for example, amplified (e.g., laser) and non-amplified light, particularly in the UV and violet wavelength regions.

The slip film is a thin layer, which protects the photopolymer from dust and increases its ease of handling. In a conventional ("analog") plate making process, the slip film is transparent to UV light, and the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate.

In a "digital" or "direct to plate" process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are then ablated by exposing the masking layer to laser radiation at a selected wavelength and power of the laser. Examples of laser ablatable layers are disclosed, for example, in U.S. Pat. No. 5,925,500 to Yang, et al., and U.S. Pat. Nos. 5,262,275 and 6,238,837 to Fan, the subject matter of each of which is herein incorporated by reference in its entirety.

Processing steps for forming relief image printing elements typically include the following:
1) Image generation, which may be mask ablation for digital "computer to plate" printing plates or negative production for conventional analog plates;
2) Back exposure to create a floor layer in the photocurable layer and establish the depth of relief;
3) Face exposure through the mask (or negative) to selectively crosslink and cure portions of the photocurable layer not covered by the mask, thereby creating the relief image;
4) Development to remove unexposed photopolymer by solvent (including water) or thermal development; and
5) If necessary, post exposure and detackification.

Removable coversheets are also typically provided to protect the photocurable printing element from damage during transport and handling. Prior to processing the printing elements, the coversheet(s) are removed and the photosensitive surface is exposed to actinic radiation in an imagewise fashion. Upon imagewise exposure to actinic radiation, polymerization, and hence, insolubilization of the photopolymerizable layer occurs in the exposed areas. Treatment with a suitable developer solvent (or thermal development) removes the unexposed areas of the photopolymerizable layer, leaving a printing relief that can be used for flexographic printing.

As used herein "back exposure" refers to a blanket exposure to actinic radiation of the photopolymerizable layer on the side opposite that which does, or ultimately will, bear the relief. This step is typically accomplished through a transparent support layer and is used to create a shallow layer of photocured material, i.e., the "floor," on the support side of the photocurable layer. The purpose of the floor is generally to sensitize the photocurable layer and to establish the depth of relief.

Following the brief back exposure step (i.e., brief as compared to the imagewise exposure step which follows), an imagewise exposure is performed utilizing a digitally-imaged mask or a photographic negative mask, which is in contact with the photocurable layer and through which actinic radiation is directed.

The type of radiation used is dependent on the type of photoinitiator in the photopolymerizable layer. The digitally-imaged mask or photographic negative prevents the material beneath from being exposed to the actinic radiation and hence those areas covered by the mask do not polymerize, while the areas not covered by the mask are exposed to actinic radiation and polymerize. Any conventional sources of actinic radiation can be used for this exposure step. Examples of suitable visible and UV sources include carbon arcs, mercury-vapor arcs, fluorescent lamps, electron flash units, electron beam units and photographic flood lamps.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or thermal development, which typically uses heat plus a blotting material. The resulting surface has a relief pattern, which typically comprises a plurality of dots that reproduces the image to be printed. After the relief image is developed, the resulting relief image printing element may be mounted on a press and printing commenced.

The shape of the dots and the depth of the relief, among other factors, affect the quality of the printed image. In addition, it is very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas.

Maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (i.e., the dot is not "held" on plate and/or on press). Alternatively, if the dots survive processing they are susceptible to damage on press. For example small dots often fold over and/or partially break off during printing, causing either excess ink or no ink to be transferred.

As described in U.S. Pat. No. 8,158,331 to Recchia and U.S. Pat. Pub. No. 2011/0079158 to Recchia et al., the subject matter of each of which is herein incorporated by reference in its entirety, it has been found that a particular set of geometric characteristics define a flexo dot shape that yields superior printing performance, including but not limited to (1) planarity of the dot surface; (2) shoulder angle of the dot; (3) depth of relief between the dots; and (4) sharpness of the edge at the point where the dot top transitions to the dot shoulder.

The inventors of the present invention have found that the use of one or more UV LED assemblies in selectively crosslinking and curing sheet photopolymers can produce a relief image comprising flexo printing dots having desirable geometric characteristics.

SUMMARY OF THE INVENTION

It is an object of the present invention to provide a method of tailoring or modifying the shape of relief printing dots in a relief image printing element for optimal printing on various substrates and/or under various conditions.

It is an object of the present invention to provide an improved method of producing relief image printing elements comprising dots having desirable geometric characteristics.

It is still another object of the present invention to create a relief image printing element that comprises printing dots having a superior dot structure in terms of print surface, edge definition, shoulder angle, depth and dot height.

It is another object of the present invention to provide an improved method of creating a relief image printing element having tailored relief dots in terms of edge definition, shoulder angle, and/or print surface.

To that end, in one embodiment, the present invention relates generally to a method of tailoring the shape of a plurality of relief printing dots created in a photosensitive printing blank during a platemaking process, said photosensitive printing blank comprising at least one photocurable layer disposed on a backing layer, the method comprising the steps of:

a) selectively exposing the at least one photocurable layer to a source of actinic radiation to selectively crosslink and cure the at least one photocurable layer; and b) developing the exposed photosensitive printing blank to reveal the relief image therein, said relief image comprising the plurality of relief printing dots;

wherein the source of actinic radiation comprises an array of UV LED light assemblies and the use of the array of UV LED light assemblies produces relief printing dots having at least one geometric characteristic selected from the group consisting of a desired planarity of a top surface of the relief printing dots, a desired shoulder angle of the relief printing dots and a desired edge sharpness of the relief printing dots.

DETAILED DESCRIPTION OF THE PREFERRED EMBODIMENTS

Figure 1:
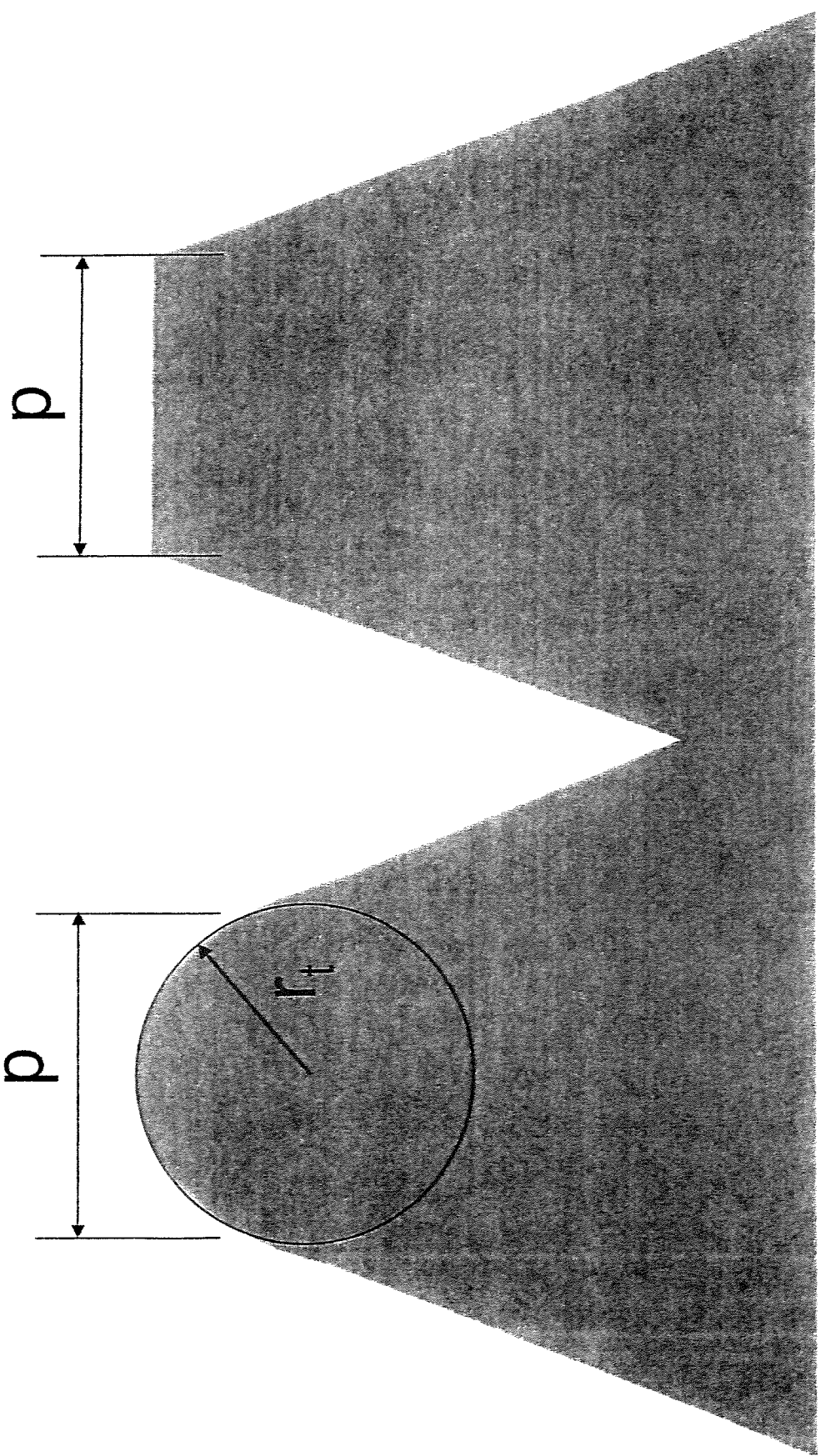
FIG. 1 depicts a means of characterizing the planarity of a dot's printing surface where p is the distance across the dot top, and $r_t$ is the radius of curvature across the surface of the dot.

The inventors of the present invention have determined that the shape and structure of the printing dots in a relief image printing element has a profound impact on the way the relief image printing element prints.

However, the inventors of the present invention have also determined that the shape and structure of the printing dots may be altered or tailored using UV LED assemblies. More specifically, the inventors of the present invention have determined that it is possible to control the dot angle of the resulting printing dots using UV LED assemblies.

It should be understood that individual UV LED assemblies can be operated at different wavelengths. It should also be understood that UV light emitting from a UV LED assembly is over a range of wavelengths, often referred to as the Spectral Energy Distribution, with a peak at one wavelength which is the identified wavelength. For example, UV LED assemblies are available in wavelengths of 365 nm, 375 nm, 385 nm, 395 nm, 405 nm and 415 nm, among others.

In one embodiment, the present invention relates generally to a method of tailoring the shape of a plurality of relief printing dots created in a photosensitive printing blank during a platemaking process, said photosensitive printing blank comprising at least one photocurable layer disposed on a backing layer, the method comprising the steps of:

a) selectively exposing the at least one photocurable layer to a source of actinic radiation to selectively crosslink and cure the at least one photocurable layer; and b) developing the exposed photosensitive printing blank to reveal the relief image therein, said relief image comprising the plurality of relief printing dots;

wherein the source of actinic radiation comprises an array of UV LED light assemblies and the use of the array of UV LED light assemblies produces relief printing dots having at least one geometric characteristic selected from the group consisting of a desired planarity of a top surface of the relief printing dots, a desired shoulder angle of the relief printing dots and a desired edge sharpness of the relief printing dots.

The at least one photocurable layer may be coated with a slip film, which is a thin layer, which protects the at least one photocurable layer from dust and increases its ease of handling. In a conventional ("analog") plate making process, the slip film is transparent to UV light, and the printer places a negative on top of the slip film layer. The plate, including the at least one photocurable layer and negative are then subjected to flood-exposure by UV light through the negative. The areas exposed to the light cure, or harden, and the unexposed areas are removed (developed) to create the relief image on the printing plate. In the alternative, a negative may be placed directly on the at least one photocurable layer.

In the alternative, in a "digital" or "direct to plate" process, the at least one photocurable layer is coated with a masking layer, which may be a slip film that has been modified to include a radiation opaque material. In this instance, a laser guided by an image stored in an electronic data file is used to create an in situ "negative" in the masking layer. Portions of the laser ablatable layer are ablated by exposing the masking layer to laser radiation at a selected wavelength and power of the laser. Thereafter, the at least one photocurable layer with the in situ negative thereon, is subjected to flood-exposure by UV light through the in situ negative. The areas exposed to the light cure, or harden, and the unexposed areas are removed (developed) to create the relief image on the printing plate. Selective exposure to the source of actinic radiation can be achieved using either the analog or digital method.

The UV LED assemblies can be positioned in a random, mixed manner or in sequential rows. For example, in a row of UV LED assemblies, the first UV LED assembly can emit light at 395 nm, the next UV LED assembly can emit light at 365 nm and the following UV LED assembly can emit light at 415 nm, and so on, repeating this pattern throughout the row. The next row and subsequent rows can have the same pattern or a different pattern. Alternatively, all of the UV LED assemblies in a row can emit light at the same wavelength (i.e., 365 nm, 395 nm, 415 nm), with the next row having UV LED assemblies that emit light at a different wavelength, and so on, and the pattern is then repeated for the remaining rows. The pattern or order can also be changed.

In a preferred embodiment, the array of UV LED light assemblies comprises at least four rows. In an array of four rows of bulbs, the first and third row could be 365 nm while the second and fourth rows could be 395 nm. Each wavelength could then be on a separate circuit which would have the ability to modulate is intensity separately, allowing the user to customize the dot formation. In one embodiment, the array of LTV LED lights could be arranged in two alternating rows of 50.

The inventors of the present invention have found that both the angle of the UV LED light assemblies and the wavelengths of the UV LED light assemblies can be varied to produce relief printing dots having the desired geometric characteristic.

In one preferred embodiment, alternating rows of UV LED lights in the array of UV LED light assemblies may have different wavelengths. These wavelengths may operate in the UV or near UV range, preferably in the range of about 320 nm to about 420 nm, more preferably within the range of about 360 nm to about 420 nm.

For example, it was found that for one photocurable formulation that a 365 nm wavelength light source yielded a sharp angled dot and that a 395 nm wavelength light source yielded a broad angled dot. By using a combination of both 365 nm and 395 nm UV LED light sources, it was found that it was possible to get a dot shape that was approximately in between the two individual light sources. Thus, in one preferred embodiment, the alternating rows of UV LED light assemblies operate at wavelengths of 365 nm and 395 nm. However, other suitable wavelengths of UV LED light assemblies and combinations thereof may also be used in the practice of the instant invention. In addition, the light intensity of each of the UV LED light assemblies can also be controlled to provide additional control and more closely customize the geometric characteristics of the relief printing dots.

In the alternative, the array of UV LED light assemblies are positioned in a random pattern of different wavelength UV LED assemblies, including, for example, 365 nm, 395 nm and/or 415 nm as opposed to alternating row of different wavelength UV LED assemblies.

The at least one photocurable layer may comprise any of the known photopolymers, monomers, initiators, reactive or non-reactive diluents, fillers, and dyes. In one embodiment, the at least one photocurable layer comprises a photoinitiator, that has a UV-Vis absorption peak that is near or in the range of the operating wavelength of the UV LED light assembly.

In another preferred embodiment, the alternating rows of UV LED light assemblies are arranged to have different angles of light, measured as the light impacts the at least one photocurable layer. Thus, it is possible to use different angles of light and a single wavelength to effectively control the shape and angle of the printing dots. For example, the alternating rows of UV LED light assemblies may comprise collimated UV LED light assemblies and non-collimated UV LED light assemblies. In another embodiment, the alternating rows of UV LED light assemblies may comprise different angles of collimation, whereby the alternating rows impact the at least one photocurable layer at different angles.

Finally, a combination of different wavelength UV LED lights and different angles of light may also be used to control the shape and angle of the printing dots.

The planarity of the top of a dot can be measured as the radius of curvature across the top surface of the dot, $r_t$, as shown in FIG. 1. It is noted that a rounded dot surface is not ideal from a printing perspective because the size of the contact patch between the print surface and the dot varies exponentially with impression force. Therefore, the top of the dot preferably has a planarity where the radius of curvature of the dot top is greater than the thickness of the photopolymer layer, more preferably twice the thickness of the photopolymer layer, and most preferably more than three times the total thickness of the photopolymer layer.

Figure 2:
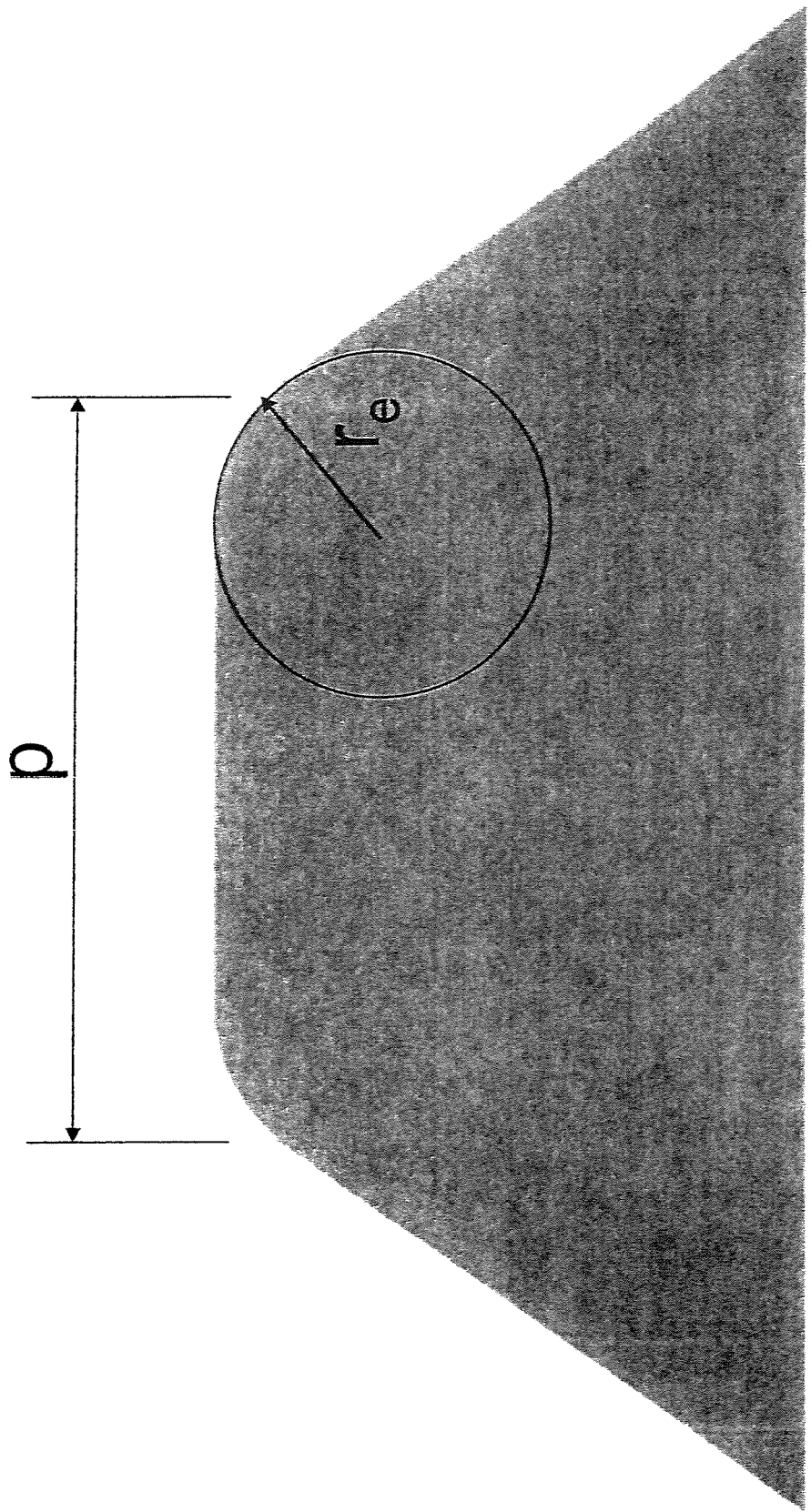
FIG. 2 depicts a flexo dot and its edge, where p is the distance across the dot top. This is used in the characterization of edge sharpness $r_e$:p, where $r_e$ is the radius of curvature at the intersection of the shoulder and the top of the dot.

The angle of the dot shoulder is defined as shown in FIG. 2 as the angle θ formed by the dot's top and side. At the extreme, a vertical column would have a 90° shoulder angle, but in practice most flexo dots have an angle that is considerably lower, often nearer 45° than 90°.

A dot shoulder angle of >50° is preferred throughout the tonal range. As used herein, dot shoulder angle means the angle formed by the intersection of a horizontal line tangential to the top of the dot and a line representing the adjacent dot side wall as shown in FIG. 2.

Figure 3:
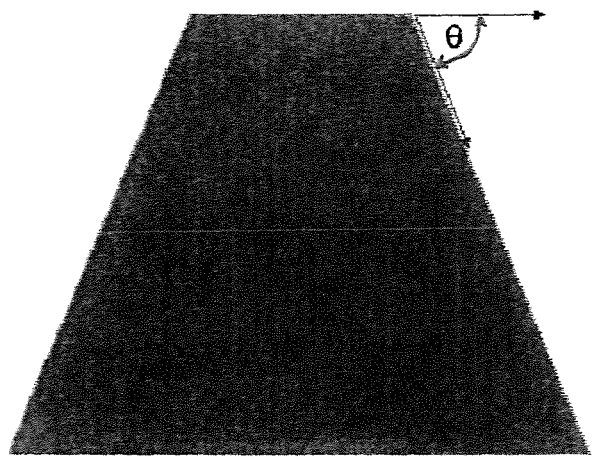
FIG. 3 depicts the measurement of the dot shoulder angle θ.

Edge sharpness relates to the presence of a well-defined boundary between the planar dot top and the shoulder and it is generally preferred that the dot edges be sharp and defined, as shown in FIG. 3. These well-defined dot edges better separate the "printing" portion from the "support" portion of the dot, allowing for a more consistent contact area between the dot and the substrate during printing.

Edge sharpness can be defined as the ratio of $r_e$, the radius of curvature (at the intersection of the shoulder and the top of the dot) to p, the width of the dot's top or printing surface, as shown in FIG. 3. For a truly round-tipped dot, it is difficult to define the exact printing surface because there is not really an edge in the commonly understood sense, and the ratio of $r_e$:p can approach 50%. In contrast, a sharp-edged dot would have a very small value of $r_e$, and $r_e$:p would approach zero. In practice, an $r_e$:p of less than 5% is preferred, with an $r_e$:p of less than 2% being most preferred. FIG. 3 depicts a flexo dot and its edge, where p is the distance across the dot top and demonstrates the characterization of edge sharpness, $r_e$:p, where $r_e$ is the radius of curvature at the intersection of the shoulder and the top of the dot.

In addition, one of the benefits of the invention described herein is that it is not necessary to perform a bump exposure. During bump exposure, a low intensity "pre-exposure" dose of actinic radiation is used to sensitize the at least one photocurable layer before the plate is subjected to the higher intensity main dose of actinic radiation. The bump exposure is applied to the entire plate area and is a short, low dose exposure of the plate that reduces the concentration of oxygen, which inhibits polymererization of the printing element and aids in preserving fine features (i.e., highlight dots, fine lines, isolated dots, etc.) on the finished plate. However, the pre-sensitization step can also cause shadow tones to fill in, thereby reducing the tonal range of the halftones of the image. Thus, the inventors of the present invention have found that the use of an array of UV LED light assemblies provides an acceptable result without the need to perform a bump exposure.

EXAMPLE I

A study was performed to evaluate photocurable compositions containing a variety of photoinitiators to study how each interacted with two wavelengths (365 nm and 395 nm) light sources. Surprisingly, it was found that both the 395 nm and 365 nm light sources produced medium to broad dots.

Three UV LED assembly units available from UV Process Supply, Inc, and having wavelengths of 365 nm, 395 nm and 415 nm, each having an intensity of about 10 to 30 mW were tested. In addition, a unit available from Digital Light Labs, Inc., having a wavelength of 365 nm and an intensity of about 175 mW as also tested.

Various formulations of photocurable sheet polymer printing plate blanks were prepared using photoinitiators having a peak around 365 nm. One example of a suitable photoinitiator is 2,2-dimethyoxy-1,2-di(phenyl)ethanone available from Ciba Specialty Chemicals, Inc. under the tradename Irgacure 651.

Figure 4:
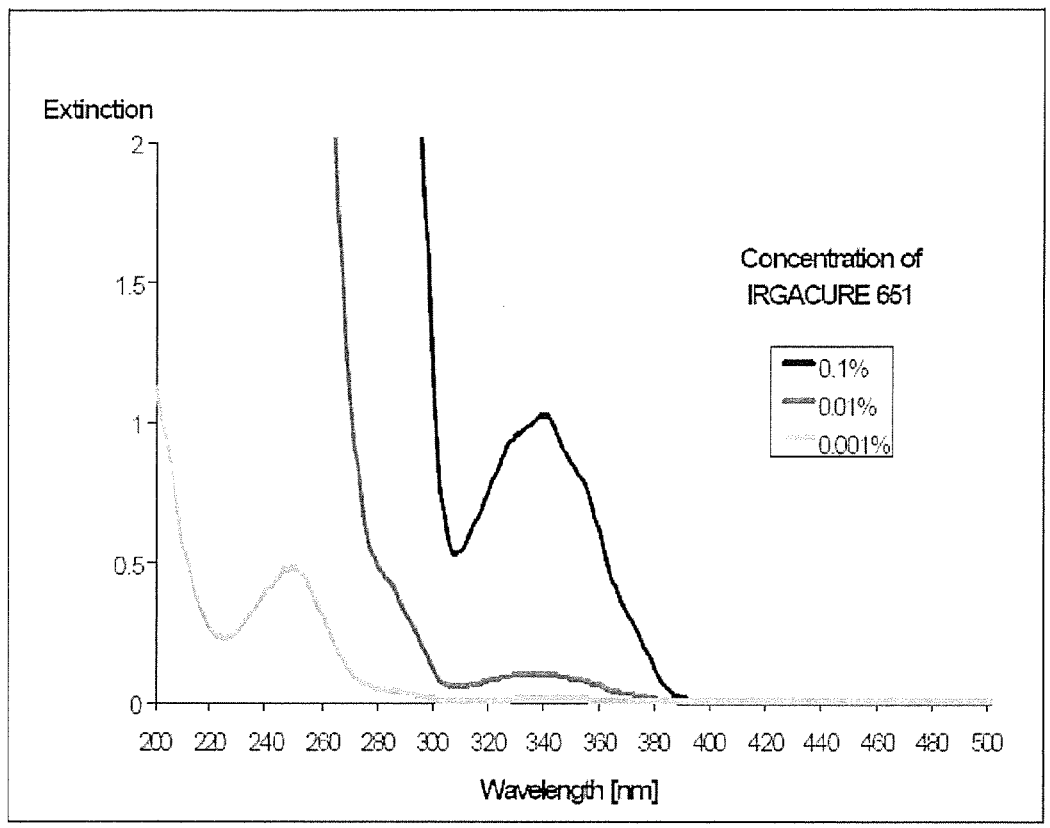
FIG. 4 depicts a UV-Vis plot of Irgacure 651.

The UV-Vis spectra of Irgacure 651 at three increasing concentrations is depicted in FIG. 4.

As may be observed in FIG. 4, Irgacure 651 has absorption peaks at 250 and 340 nm. For reference, the UV-Vis spectrum of the 395 nm LED assembly available the UV Process Supply, Inc. has a very narrow band width, which is typical of UV LED light sources. As such, one might assume that a 395 nm light source would be outside the usable range for Irgacure I-651. However, it was found that the photopolymer formulation containing Irgacure I-651 cured quite well with the 395 nm light source. The band width of the UV Process Supply, Inc. 365 nm LED light source is also quite narrow.

Figure 5:
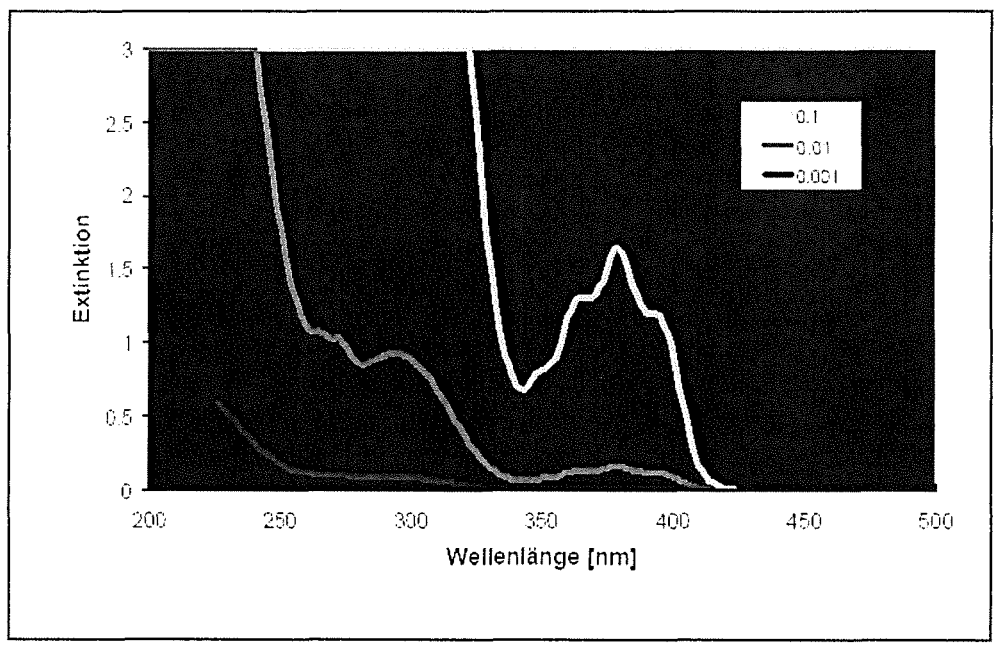
FIG. 5 depicts a UV-Vis plot of Darocur TPO.
Figure 6:
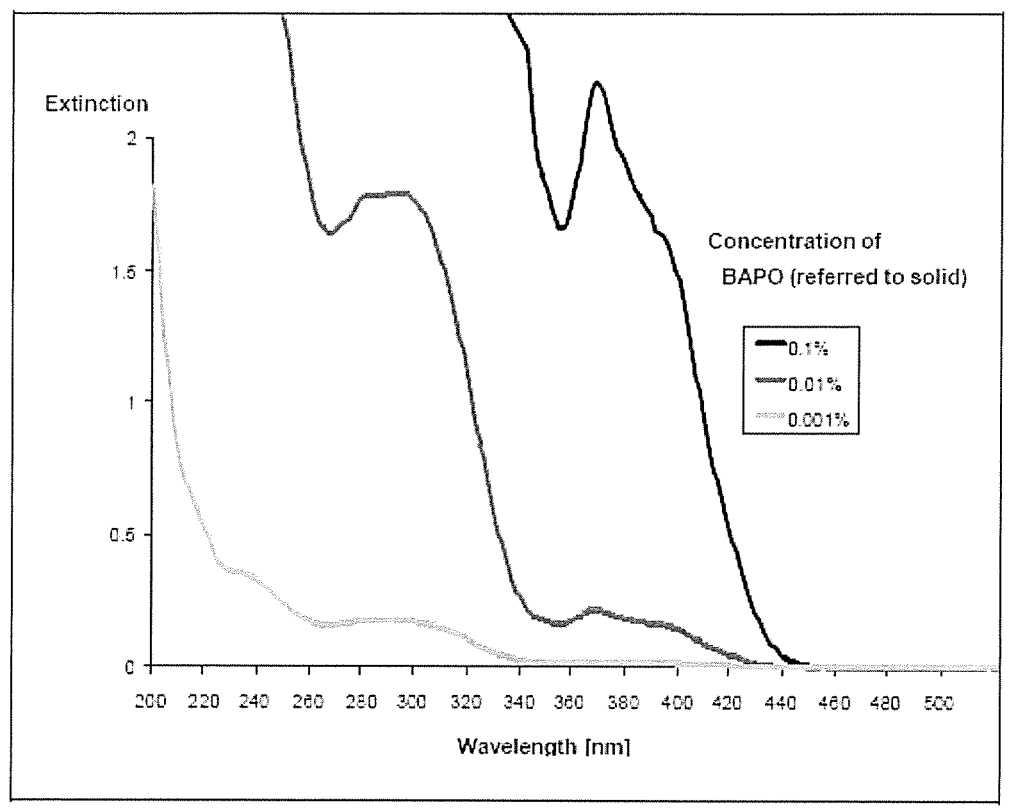
FIG. 6 depicts a UV-Vis plot of Irgacure 819.

Two commercially available types of photoinitiators that are advertised to initiate with higher wavelengths are mono acyl phosphine (MAPO) and bis acyl phosphine (BAPO). MAPO photoinitiators include diphenyl(2,4,6-trimethylbenzoyl)-phosphine oxide, available commercially from BASF under the tradename Darocur TPO. BAPO photoinitiators include phenyl bis(2,4,6-trimethyl benzoyl)phosphine oxide, available commercially from BASF under the tradename Irgacure 819. The UV-Vis plots of Darocur TPO and Irgacure 819 are shown in FIGS. 5 and 6. MAPO's absorption peaks are at 295 nm, 368 nm, 380 nm and 393 nm. BAPO's absorption peaks are at 295 nm and 370 nm. Other photoinitiators that are advertised to initiate with higher wavelengths include Bis(eta 5-2,4-cyclopentadien-1-yl)Bis[2,6-difluoro-3-)1H-pyrrol-1-yl)phenyl]titanium, which is a metallocene that is commercially available from BASF under the tradename Irgacure 784 and which has absorption peaks at 398 and 470.

The main difference between MAPO and BAPO is that BAPO generates two radicals per molecule when energized, while MAPO only generates one radical per molecule. In addition to MAPO and BAPO, three additional common UV initiated photoinitiators were examined—Irgacure 651 (α,α-dimethoxy-α-phenylacetophenone), Irgacure 184 (1-hydroxy-cyclohexyl-phenyl-ketone), and Irgacure 369 (2-benzyl-2-(dimethylamino)-1-[4-(4-morpholinyl)-1-propanone).

Table 1 describes various high level and low level photoinitiator formulations that were used to investigate the use of UV LEDs to crosslink and cure photosensitive formulations in the preparation of relief image printing plates.

TABLE 1

Photosensitive formulations containing various photoinitiators

|  | 651 LO | 651 HI | 184 LO | 184 HI | 369 LO | 369 HI | 819 LO | 819 HI | TPO LO | TPO HI |
|---|---|---|---|---|---|---|---|---|---|---|
| Kraton D1102 | 61.00 | 61.00 | 61.00 | 61.00 | 61.00 | 61.00 | 61.00 | 61.00 | 61.00 | 61.00 |
| Ricon 130 | 26.50 | 26.50 | 26.50 | 26.50 | 26.50 | 26.50 | 26.50 | 26.50 | 26.50 | 26.50 |
| HDDA | 9.00 | 9.00 | 9.00 | 9.00 | 9.00 | 9.00 | 9.00 | 9.00 | 9.00 | 9.00 |
| Irgacure 651 | 0.50 | 2.00 |  |  |  |  |  |  |  |  |
| Irgacure 184 |  |  | 0.50 | 2.00 |  |  |  |  |  |  |
| Irgacure 369 |  |  |  |  | 0.50 | 1.33 |  |  |  |  |
| Irgacure 819 |  |  |  |  |  |  | 0.50 | 2.00 |  |  |
| TPO |  |  |  |  |  |  |  |  | 0.50 | 2.00 |
| BHT | 1.20 | 1.20 | 1.20 | 1.20 | 1.20 | 1.20 | 1.20 | 1.20 | 1.20 | 1.20 |
| Savinyl Red 3BLS | 0.01 | 0.01 | 0.01 | 0.01 | 0.01 | 0.01 | 0.01 | 0.01 | 0.01 | 0.01 |

Each photoinitiator was made up at 0.5% and 2.0% levels in the photosensitive formulation, except that the high level of Irgacure 369 and the high level of Irgacure 819 were not run because they did not dissolve completely. After all of the plates were formulated, their back exposure cure speeds were determined using a standard clam shell exposure unit (fluorescent 365 nm tubes), as set forth in Table 2.

TABLE 2

Back exposure cure speeds of photosensitive formulations containing various photoinitiators

| Time (sec) | 651 LO | 651 HI | 369 LO | 369 HI | 184 LO | 184 HI | TPO LO | TPO HI | 819 LO |
|---|---|---|---|---|---|---|---|---|---|
| 0 | 7 | 7 | 7 | 7 | 7 | 7 | 7 | 7 | 7 |
| 30 | 7 | 7.0 | 7.0 | 16.0 | 7 | 7 | 12.8 | 14.7 | 16.2 |
| 40 | 7 | 1.2 | 7.0 | 23.3 | 7 | 7 | 21.0 | 16.5 | 23.8 |
| 50 | 7 | 17.7 | 11.8 | 26.8 | 7 | 7 | 29.2 | 18.2 | 32.2 |
| 60 | 7 | 21.7 | 17.8 | 31.0 | 7 | 7 | 29.3 | 19.0 | 34.3 |
| 70 | 7 |  | 22.0 |  | 7 | 7 | 32.3 | 20.0 | 36.7 |
| 120 | 7.0 |  |  |  | 7 | 7 |  |  |  |
| 150 | 21.8 |  |  |  | 7 | 7 |  |  |  |
| 180 | 31.5 |  |  |  | 7 | 7 |  |  |  |
| 210 | 39.0 |  |  |  | 7 | 7 |  |  |  |
| 240 | 43.5 |  |  |  | 7 | 7 |  |  |  |

For a 45 G sheet plate, the target floor was 25 to 30 mils. Neither level of Irgacure I-184 yielded any floor after four minutes on the clam shell. Ten full minutes with the high level of Irgacure I-184 was needed to yield a 25 mil floor. However, it was later found that the lack of floor cure by Irgacure 184 was due mainly to the PET that was used. When a low UV absorbing PET was used, the Irgacure 184 easily cured the floor.

It was interesting that some of the photoinitiators actually built a floor faster than Irgacure I-651, which is commonly used in printing plate formulations. It was noted that the high level Darocur TPO formed a floor slower than the lower level Darocur TPO, which may be due to the absorption via the cleaved Darocur TPO molecule. The plates were made on DTF628 polyethylene terephthalate (PET) at 045 G thick. The DTF628 PET absorbs a lot of light at 365 nm, thus it is believed that the use of a different PET may yield faster floor building results.

Figure 7:
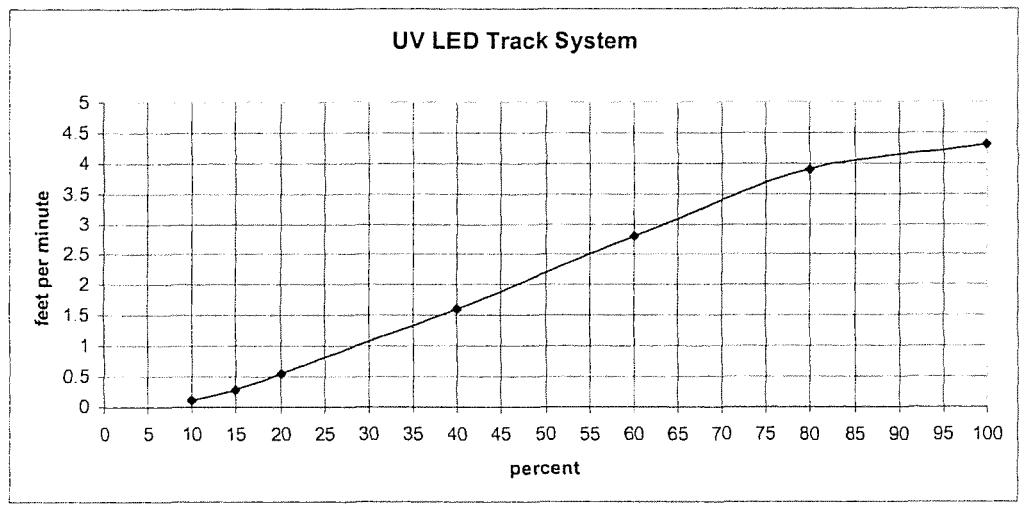
FIG. 7 depicts line speeds of a UV track system for specific inputs.
Figure 8:
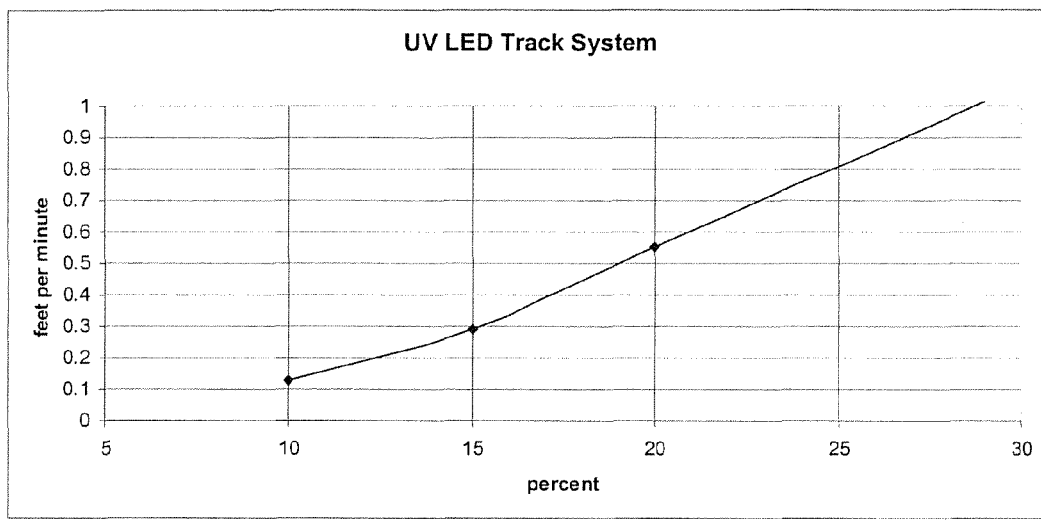
FIG. 8 depicts a UV trace system expanded slow range.

Thereafter, digitally ablated plates with pre-cured floors were placed under the different UV LED light sources on a UV track system, which was designed to be very stable at very slow operating speeds. A graphic of line speeds for specific percent inputs was mapped out and is shown in FIGS. 7 and 8. As may be observed in the plots, the speed is essentially linear from 20% input to 80% input. The fastest forward direction is about 4.2 fpm. The top speed is about 7 fpm and occurs on the return (reverse) direction, but is not adjustable. For purposes of this study, a line speed of 0.13 fpm (10% input) was chosen. The output was not limited and the height from the light source to the plate surface was set to 0.5 inch.

Figure 9:
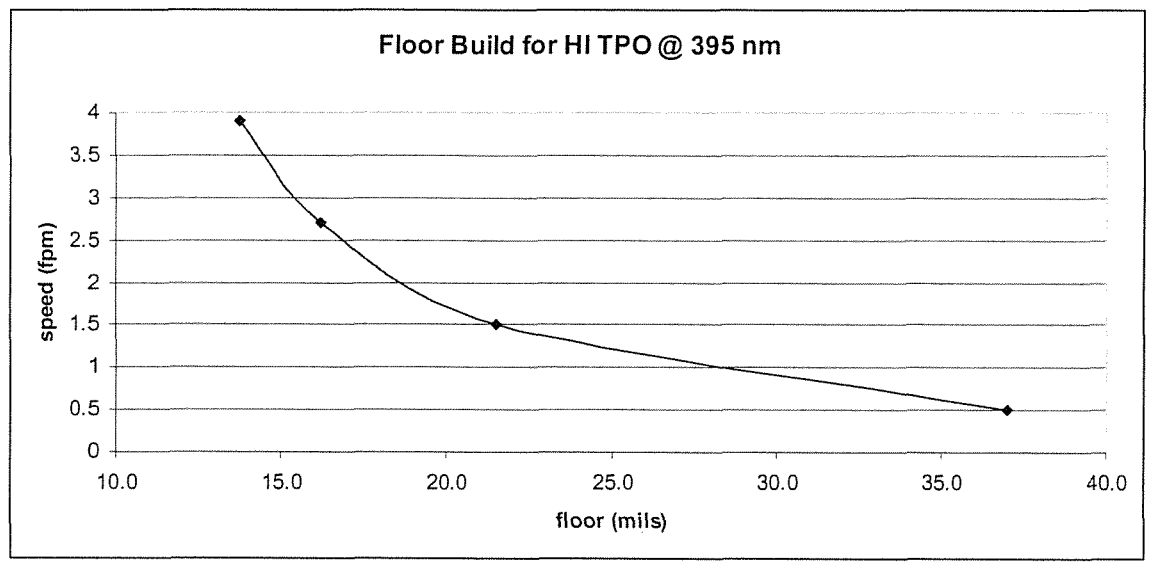
FIG. 9 depicts the floor build for high level Darocur TPO exposed at 395 nm.

FIG. 9 depicts the floor building profile utilizing the high level TPO formulation in combination with the UV Process 395 nm LED light source. The UV track system was run at specific settings and the plates were processed (i.e., developed) in solvent.

Figure 10:
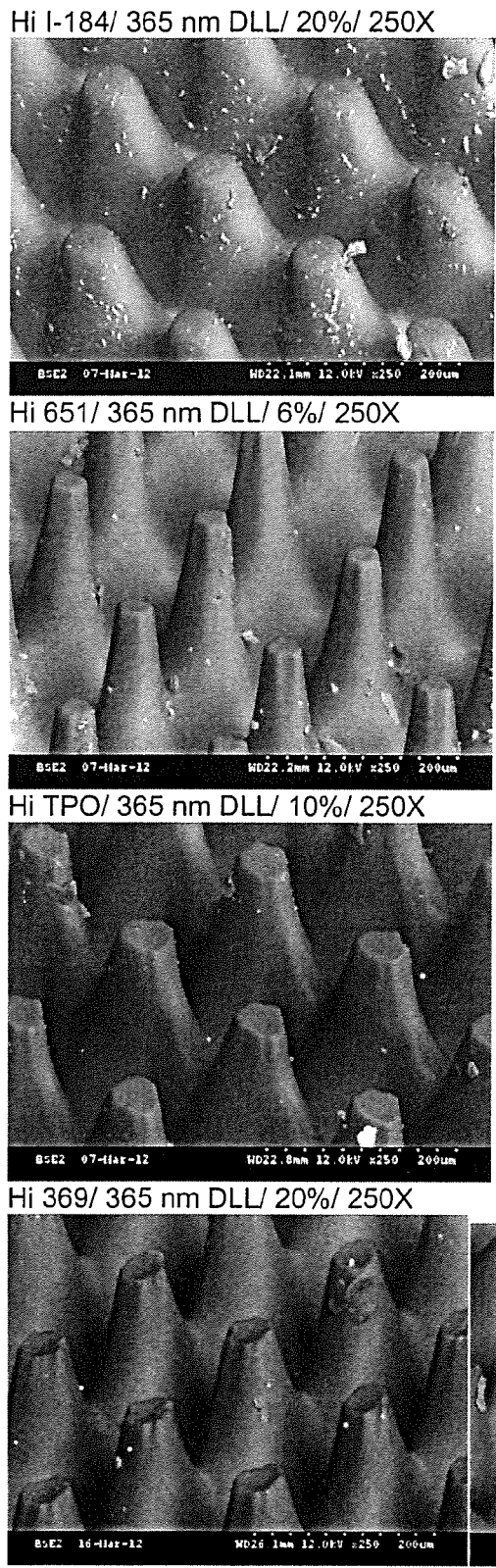
FIG. 10 depicts SEM images of various photopolymer compositions exposed using the Digital Light Labs 365 nm light source at a 25% input level.

FIG. 10 depicts SEM images of dots from the combination of the Digital Light 365 nm unit with each of the photoinitiator formulations tested.

As can be seen, several of the formulations tested exhibited excellent dot shape under a 365 nm light source. While the low level Irgacure I-189 formulation started to form flat dots, the Irgacure I-651, Darocur TPO and Irgacure I-369 formulations exhibited true flat topped dots. The low level of each photoinitiator formulation evaluated exhibited the standard rounded digital dot formation. While the Irgacure I-651 dots were like telephone poles, it appeared that the Darocur TPO and Irgacure I-369 formulations would print well.

Figure 11:
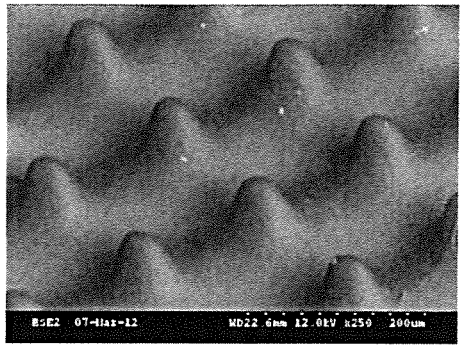
FIG. 11 depicts SEM images of various photopolymer compositions exposed using the UV Process Supply 395 nm light source.
Figure 11:
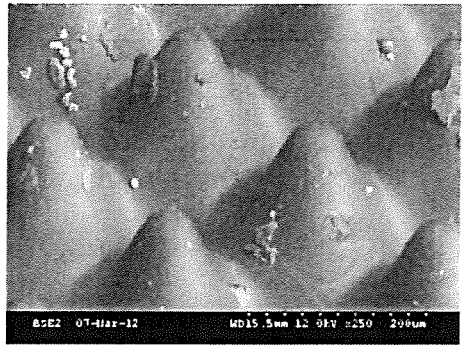
Figure 11:
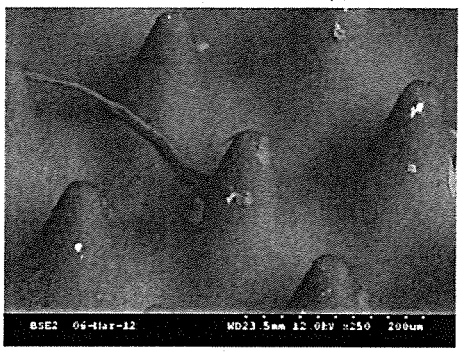
Figure 11:
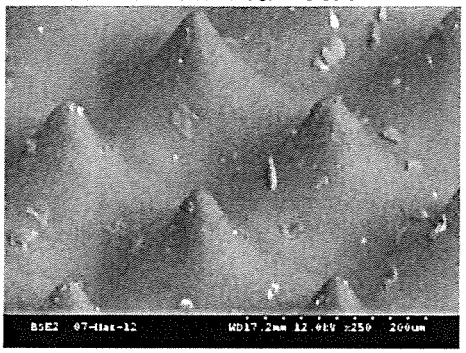
Figure 11:
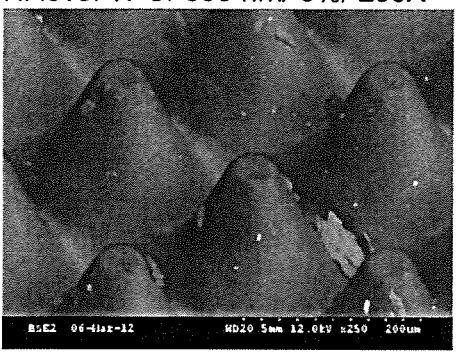
Figure 11:
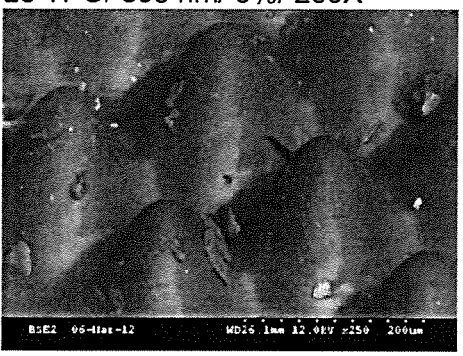

FIG. 11 depicts the SEM images of dots for different formulations cured with the UV Process 395 nm light unit.

The Irgacure I-184 and Irgacure I-651 formulations are not shown because they were incapable of holding any dots. The formulations holding the most promise for dot formulation using a 395 nm light source contained Darocur TPO and Irgacure I-369 as the photoinitiator.

Figure 12:
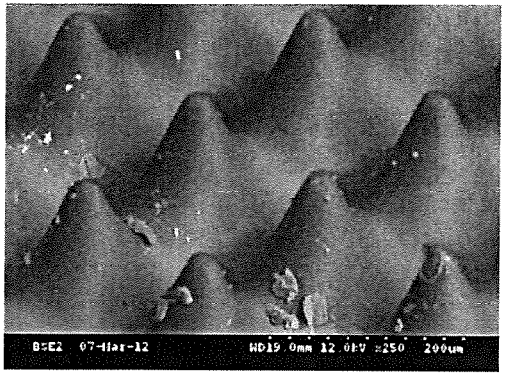
FIG. 12 depicts SEM images of various photopolymer compositions exposed using the UV Process Supply 415 nm light source.
Figure 12:
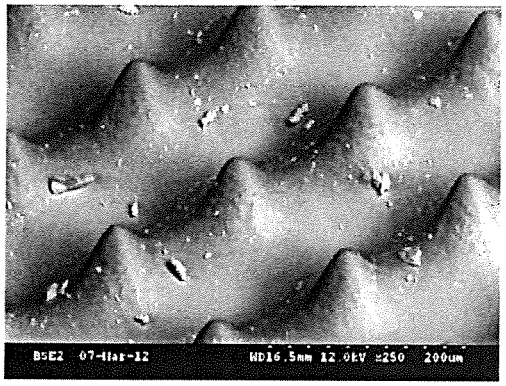
Figure 12:
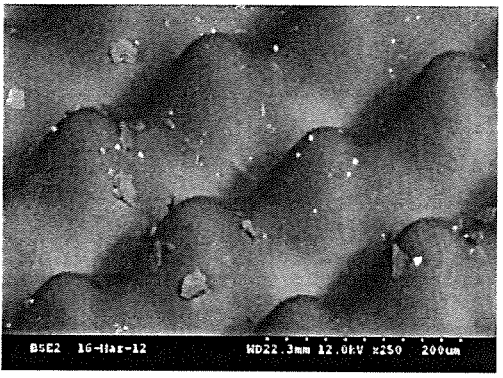
Figure 13:
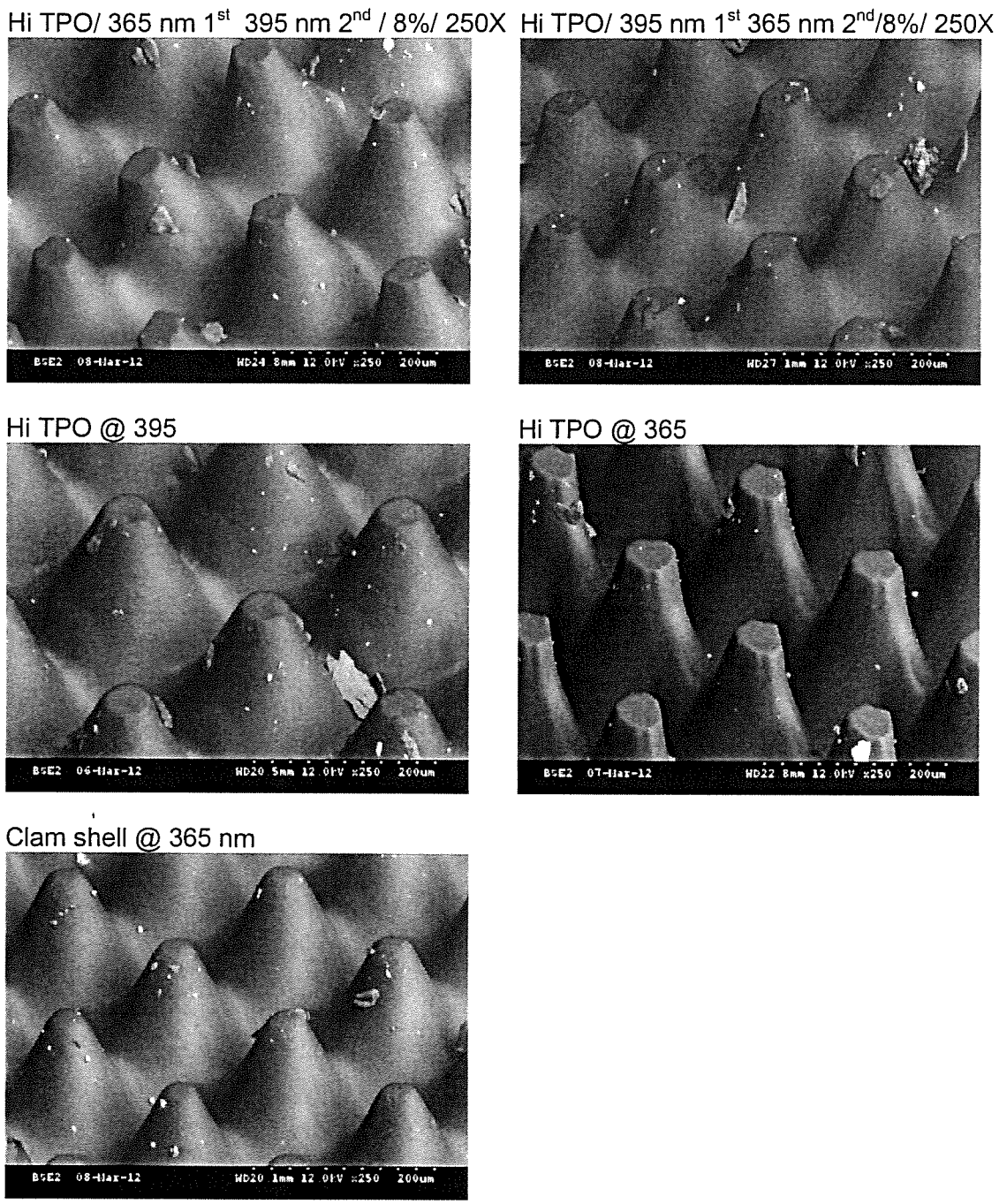
FIG. 13 depicts SEM images of various photopolymer compositions exposed using a mixture of 365 nm and 395 nm light sources.

However, only the TPO formulation was observed to form acceptable dots with the UV Process 415 nm LED assembly as seen in FIG. 12.

The best dot formation was at 365 nm with the Irgacure I-651 and Darocur TPO photoinitiators, and with the Darocur TPO photoinitiator at 395 nm. Therefore, it was decided to attempt to combine two wavelengths in a serial exposure sequence. The high level Darocur TPO formulation was cured first with one wavelength and then immediately after by the other wavelength. The order of the light sources was then switched and run again with the high level Darocur TPO.

FIG. 15 shows the results of these light combinations with Darocur TPO. The individual wavelength runs are shown as well for comparison as is a clam shell exposure. The results show that the dots were an average in width between the two individual exposures. Thus it can be seen that a specific design of a UV LED assembly array can be optimized for a specific dot formation.

The Irgacure I-651 formulation was not run because there was little dot formation seen at the 395 nm wavelength, although it is believed that it would be possible to use a higher ratio of 365 nm versus the 395 nm wavelength to adjust the dot shape.

It was surprisingly discovered that the best dot formation occurred with the Darocur TPO and a 365 nm wavelength LED light source. Another surprise was how well the Irgacure I-369 photoinitiator performed with the 365 nm LED light source.

The results indicated that the use of a mixture of wavelengths may minimize the effect. That is, instead of using two different light sources in succession, a light source can be constructed so that bulbs of different wavelengths are dispersed throughout the array.

For example, the UV LED light assembly may comprise an array arranged as four rows of bulbs. The first and third rows of the array may be 365 nm, while the second and fourth rows of the array may be 395 nm. Each wavelength can then be on a separate circuit which would have the ability to modulate the intensity separately, allowing the user to customize the dot formation.

What is claimed is:

1. A method of tailoring the shape of a plurality of relief printing dots created in a photosensitive printing blank during a platemaking process, said photosensitive printing blank comprising at least one photocurable layer disposed on a backing layer, the method comprising the steps of:
   a) selectively exposing the at least one photocurable layer to a source of actinic radiation to selectively crosslink and cure the at least one photocurable layer; and
   b) developing the exposed at least one photocurable layer of photosensitive printing blank to reveal a relief image therein, said relief image comprising the plurality of relief printing dots;
   wherein the source of actinic radiation comprises an array of UV LED lights arranged in a pattern; wherein the pattern of UV LED lights comprises at least one of UV LED lights that operate at different wavelengths, UV LED lights that have different angles of light, and UV LED lights controlled to provide different light intensities;
   wherein the array of UV LED lights produces relief printing dots having at least one geometric characteristic selected from the group consisting of a desired planarity of a top surface of the relief printing dots, a desired shoulder angle of the relief printing dots and a desired edge sharpness of the relief printing dots.

2. The method according to claim 1, wherein the pattern of UV LED lights comprises UV LED lights arranged in at least four rows.

3. The method according to claim 2, wherein alternate rows of UV LED lights have different peak wavelengths.

4. The method according to claim 3, wherein the alternate rows of UV LED lights in the array of UV LED lights operate at wavelengths in the range of 360 nm to 420 nm.

5. The method according to claim 3, wherein the alternate rows of UV LED lights operate at wavelengths of 365 nm and 395 nm.

6. The method according to claim 1, wherein the at least one photocurable layer comprises a photoinitiator, wherein said photoinitiator has a UV-Vis absorption peak in the range of the operating wavelength of the UV LED light assembly.

7. The method according to claim 1, wherein the pattern of UV LED lights comprises UV LED lights arranged to have different angles of light.

8. The method according to claim 7, wherein the UV LED lights are arranged in rows and alternate rows of UV LED lights comprise collimated UV LED lights and non-collimated UV LED lights.

9. The method according to claim 1, wherein the angle of the relief printing dot shoulder is greater than about 50°.

10. The method according to claim 1, wherein the edge sharpness of the relief printing dots, defined as the ratio of the radius of curvature $r_e$ at the intersection of a shoulder and the top of the relief printing dot to the width of the dot's top printing surface p is less than about 5%.

11. The method according to claim 10, wherein the ratio of $r_e$:p is less than about 2%.

12. The method according to claim 1, wherein a bump exposure is not performed.

13. A method according to claim 1, wherein the array of UV LED lights comprises at least two LED lights which have peak wavelengths that are different from each other.

14. A method according to claim 1 wherein the relief printing dots comprise a planarity that is greater than a thickness of the at least one photocurable layer.

\* \* \* \* \*